(12) United States Patent
Bradley et al.

(10) Patent No.: US 10,064,317 B1
(45) Date of Patent: Aug. 28, 2018

(54) HIGH ISOLATION SHIELD GASKET AND METHOD OF PROVIDING A HIGH ISOLATION SHIELD GASKET

(71) Applicant: ANRITSU COMPANY, Morgan Hill, CA (US)

(72) Inventors: Donald Anthony Bradley, Morgan Hill, CA (US); Anthony Alan Vega, San Jose, CA (US); Somesh M. Wadhwa, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 0 days.

(21) Appl. No.: 15/336,685

(22) Filed: Oct. 27, 2016

Related U.S. Application Data

(60) Provisional application No. 62/247,031, filed on Oct. 27, 2015.

(51) Int. Cl.
*H05K 9/00* (2006.01)

(52) U.S. Cl.
CPC ......... *H05K 9/0015* (2013.01); *H05K 9/0049* (2013.01)

(58) Field of Classification Search
CPC .................................................... H05K 9/0015
See application file for complete search history.

(56) References Cited

U.S. PATENT DOCUMENTS

| | | | | |
|---|---|---|---|---|
| 5,731,541 A | * | 3/1998 | Bernd | B29C 31/045 174/358 |
| 6,312,550 B1 | * | 11/2001 | Tiburtius | H05K 9/0015 156/244.22 |
| 6,490,438 B1 | * | 12/2002 | Wu | H04B 1/3833 361/816 |
| 9,439,307 B2 | * | 9/2016 | Swafford | H05K 5/0217 |

* cited by examiner

*Primary Examiner* — Hung V Ngo
(74) *Attorney, Agent, or Firm* — Tucker Ellis LLP (57) ABSTRACT

In accordance with an embodiment, a method of providing a gasket on an electromagnetic interference (EMI) shield adapted to isolate a plurality of components of a measurement instrument includes obtaining a shield bottom of the EMI shield, cleaning the shield bottom, plugging threaded holes within the shield bottom so that threads of the threaded holes are substantially unexposed, applying a gasket layer to the shield bottom, and unplugging the threaded holes so that the threads are exposed.

12 Claims, 8 Drawing Sheets

HIGH ISOLATION SHIELD GASKET AND METHOD OF PROVIDING A HIGH ISOLATION SHIELD GASKET

CLAIM OF PRIORITY

This application claims the benefit of priority to U.S. Provisional Application titled "HIGH ISOLATION SHIELD GASKET AND METHOD OF PROVIDING A HIGH ISOLATION SHIELD GASKET", Application No. 62/247,031, filed Oct. 27, 2015, which application is herein incorporated by reference.

TECHNICAL FIELD

The present invention relates generally to electromagnetic interference (EMI) shields and in particular to methods of applying gaskets to EMI shields to provide isolation for components of measurement instruments.

BACKGROUND

Figure 1:
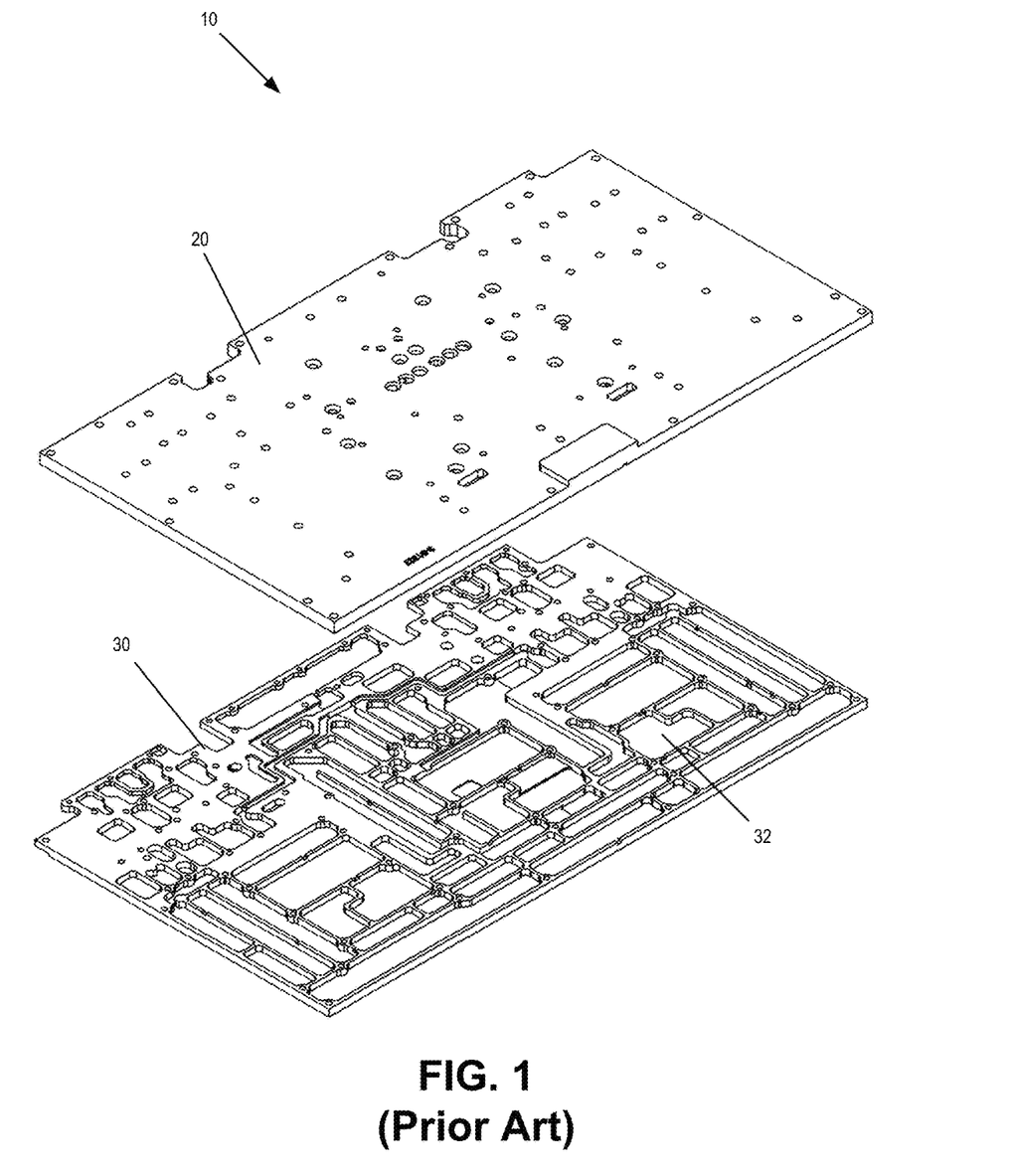
FIG. 1 illustrates an exemplary EMI shield for components of a VNA for which embodiments of methods in accordance with the present invention can be applied.

Shield gaskets are used in combination with shields to provide isolation from electromagnetic interference (EMI) for printed circuit board (PCB) and other components of measurement instruments. For example, vector and scalar network analyzers, spectrum analyzers, and other measurement instruments used in communication systems design and testing include multiple components that must be isolated from one another and that must be isolated from an external environment. FIG. 1 illustrates one example of a shield 10 for use in separating components of a vector network analyzer (VNA). The shield comprises a shield bottom 30 including a plurality of cavities or pockets 32 within which components of the VNA are arranged. As shown, the shield bottom can comprise an aluminum block into which pockets are milled, each being sized and shaped based in part on the component to be held within the pocket and the frequency of signals generated or passing through the component. The shield further comprises a shield top 20 that is mated with the shield bottom to encapsulate the components.

Due to imperfections in the mating surfaces of the shield top and shield bottom, gaskets are used to improve isolation. Shield gaskets can minimize cross-talk and susceptibility to EMI, and thereby maximize performance and reliability in smaller form factors. Present shielding gaskets include Form-in-Place ("FIP") gaskets which resemble toothpaste squirted on the mating surface of a shield bottom in selected areas, or Formed gaskets which are analogous to a head gasket on an internal combustion engine. Both techniques for applying the gasket are expensive when high isolation is required, time consuming, and require complicated rules for component layout within the shield to enable application of the gasket material.

SUMMARY

In accordance with an embodiment, a method of providing a gasket on an electromagnetic interference (EMI) shield adapted to isolate a plurality of components of a measurement instrument includes cleaning a shield bottom of the EMI shield, plugging threaded holes within the shield bottom so that threads of the threaded holes are substantially unexposed, applying a gasket layer to the shield bottom, and unplugging the threaded holes so that the threads are exposed. The shield bottom can include a metallic substrate including a plurality of pockets, each pocket adapted to receive a component of the measurement instrument. The shield bottom has a mating surface adapted to be mated with a shield top of the EMI shield to enclose the received components of the measurement instrument. The gasket layer is applied by spraying a gasket material over the exposed surface until the gasket layer is formed having a thickness at the mating surface of the shield bottom within a prescribed range. The gasket layer is flexible and conductive.

In accordance with an embodiment, the threaded holes are plugged via a plurality of pegs each having a diameter approximating an inner diameter of a thread of a threaded hole to which it is to be mated. The plurality of pegs can extend from a fixture with a layout of the plurality of pegs extending from the fixture complementing a pattern of the threaded holes within the shield bottom.

In accordance with an embodiment, the method further includes applying a second gasket layer to an exposed surface of the shield top by spraying the gasket material over the exposed surface until a second gasket layer is formed having a thickness within a second prescribed range.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details.

In other instances, well-known features have not been described in detail so as not to obscure the invention.

Figure 2:
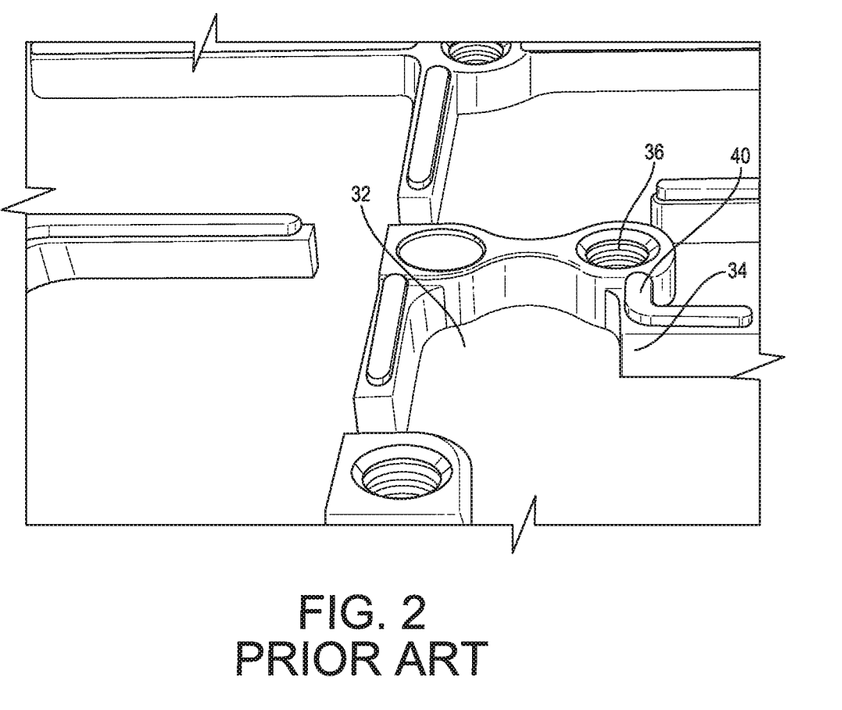
FIG. 2 illustrates a gasket material provided on a portion of an EMI shield of a measurement instrument, in accordance with the prior art.

FIG. 2 illustrates a Form-in-Place (FIP) process and gasket material which, as described above, resembles toothpaste applied to the mating surface of a shield bottom in select areas. The FIP process can include dispensing a conductive FIP material, for example, from an applicator using a computer numeric control (CNC) machine programmed according to the pocket layout 32, 34 of the shield bottom. The process of applying the gasket material 40 can be time consuming and provide opportunities for leakage where gaps exist in the gasket material resulting from the applicator turning off to pass over a shield mounting hole 36, leaving openings between pockets. Such a technique can be cumbersome and suboptimal. As an example, gaskets for two halves of a shield such as the shield illustrated in FIG. 1 comprising an assembly roughly 8×12 inches with approximately fifty pockets can approach $4400 for both halves. Form-in-place piece costs can be reduced if less isolation is needed by using a less expensive gasket material.

A Formed gasket technique uses a gasket resembling a head gasket for an internal combustion engine, where a pattern is pre-defined and carefully mated to the shield of the measurement instrument. As will be appreciated, peeling can occur along short sections, for example between shield mounting holes, which can result in openings existing between pockets. This can cause constraints on PCB design.

Figure 3:
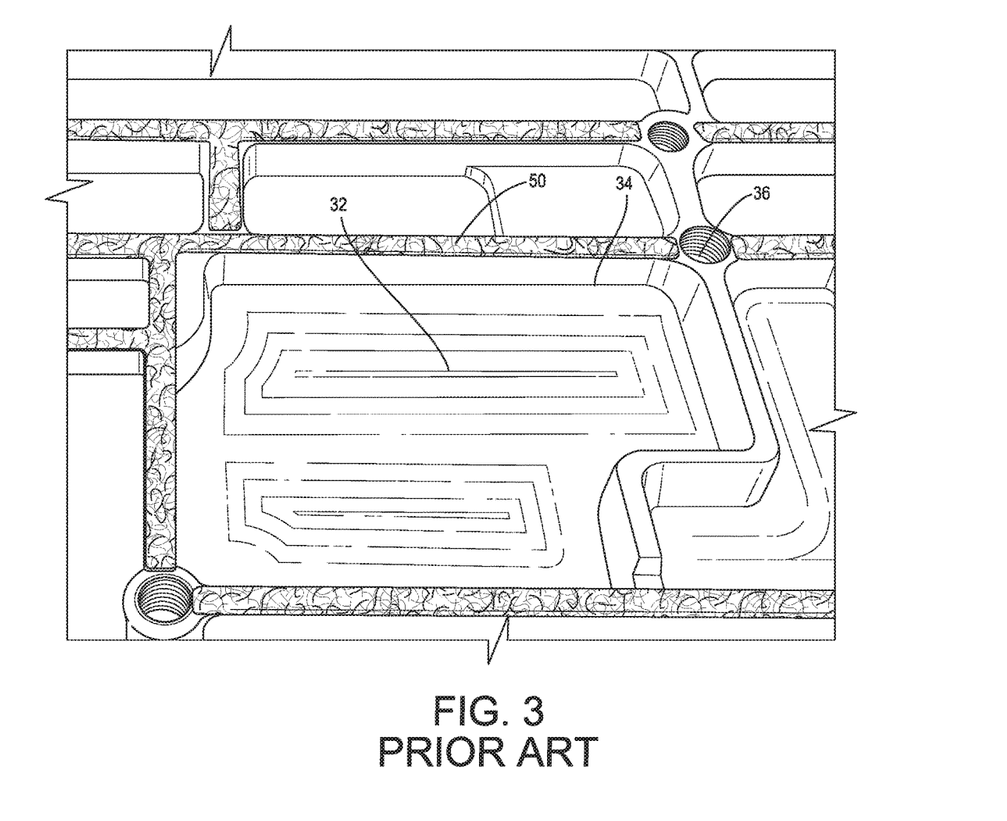
FIG. 3 illustrates an alternative gasket material provided on an EMI shield of a measurement instrument, in accordance with the prior art.

FIG. 3 illustrates a further prior art technique that can be applied, for example, to prototype pocket layouts for devices such as measurement instruments or pocket layouts for very low volume devices where strips of conductive, wire mesh material 50 having adhesive backing are applied in sections. For the shield of FIG. 1, manual application of the strips can be slow and cumbersome. Further, manual application can result in peeling and/or misapplication.

Figure 4:
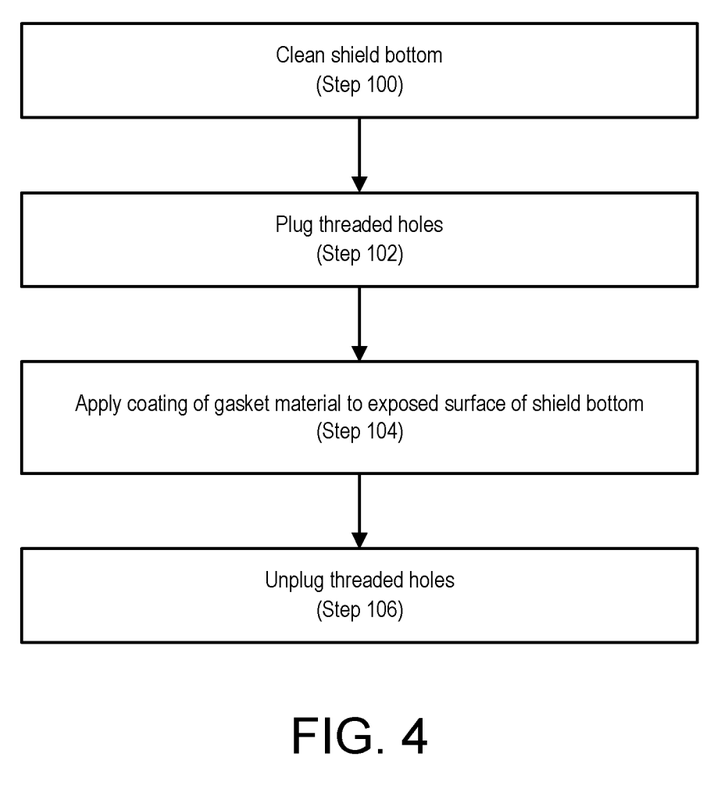
FIG. 4 is a flowchart for a method of providing a gasket layer on an EMI shield for a measurement instrument, in accordance with an embodiment.
Figure 5:
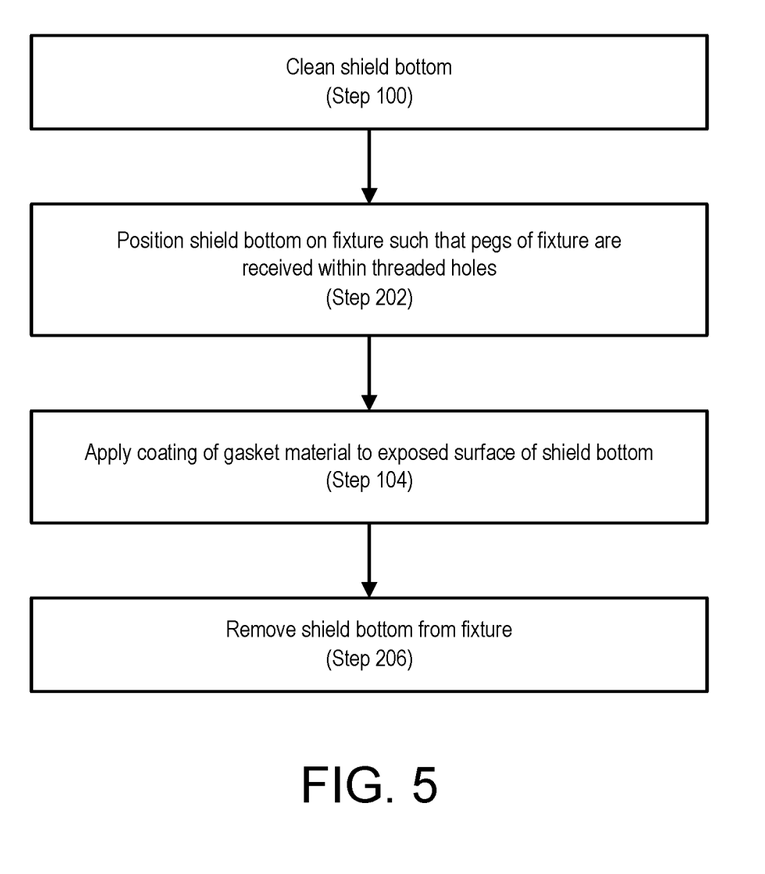
FIG. 5 is a flowchart for a method of providing a gasket layer on an EMI shield for a measurement instrument, in accordance with another embodiment.
Figure 6:
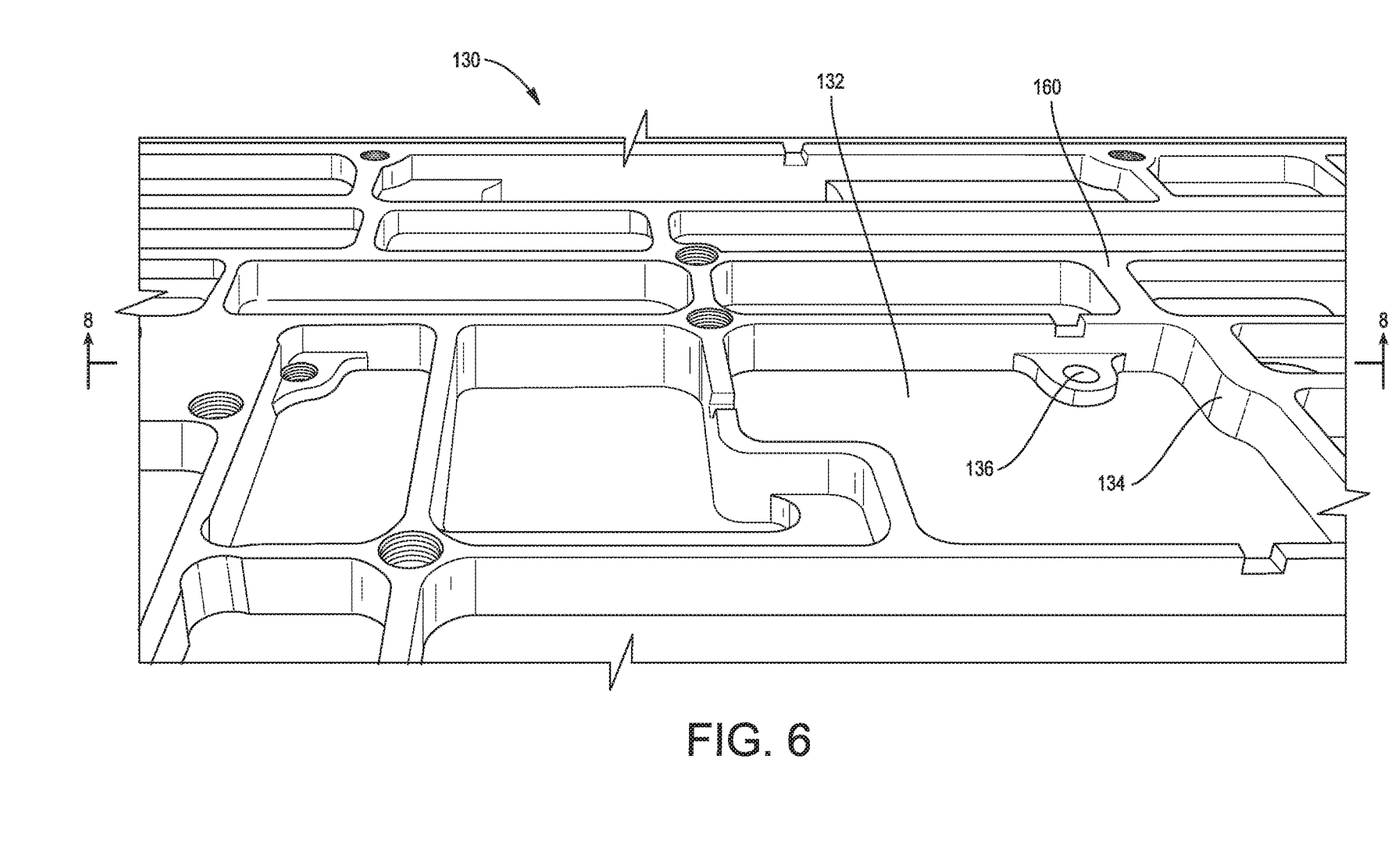
FIG. 6 illustrates the EMI shield of a measurement instrument to which a method and gasket material has been applied, in accordance with an embodiment.

FIGS. 4-6 illustrates a method and gasket material applied to a shield to provide a gasket seal, in accordance with an embodiment. The method and gasket material can provide a more cost effective, high isolation shield gasket. The method and gasket material is usable in applications that use other gasket techniques, including but not limited to VNAs, spectrum analyzers, passive intermodulation (PIM) analyzers, signal analyzers, and other measurement instruments used in communication systems design and testing.

In accordance with embodiments, methods and shield gasket materials comprise a spray-on conductive coating applied to an exposed surface of a shield. Referring to FIG. 4, in an embodiment, a method for applying a shield gasket layer to a shield bottom can comprise cleaning the shield bottom (Step 100), plugging threaded holes (e.g., shield mounting holes) of the shield bottom (Step 102) and applying a coating of gasket material to the exposed surface of the shield bottom (Step 104). The threaded holes are then unplugged (Step 106).

Cleaning the exposed surface of the shield bottom can include applying a degreaser to the shield bottom, for example via dipping the shield bottom in a degreasing solution or spraying the shield bottom with a degreasing solution. A degreasing solution can, for example, be an alcohol-based solution. The degreaser is then allowed to evaporate. In a preferred embodiment, the coating of gasket material is applied by spraying the shield bottom. Overspray on the sides of the shield is permissible.

The gasket material selected for application can include a conductive material having a consistency of a thin fluid with a lower viscosity than a material selected for FIP application so as to be capable of being sprayed. In accordance with an embodiment, the shield gasket material can be a material such as CHO-SHIELD® 4966, available from Parker Chomerics (the specification sheet for which is incorporated herein by reference), which is marketed and sold for use on silicone substrates but which has been observed by the inventor to be usable on a metallic substrate such as that of the shield. CHO-SHIELD® 4966 is a conductive silver-filled silicone coating that is capable of providing 60 dB of shielding effectiveness above 30 MHz. The coating utilizes heat for cure which varies with substrate type. In an embodiment, the gasket material can be applied to all surfaces such that a gasket layer within a range of approximately 0.005 inches to 0.007 inches thick along the mating surface of the shield bottom is formed. However, in other embodiments a layer having some other thickness can be applied.

Embodiments in accordance with the present invention should not be construed as being limited to utilizing CHO-SHIELD® 4966, or any other specific material from any particular vendor. Rather, some other conductive shield material capable of being applied to a metallic surface such as aluminum can be used. Preferably, a material is used having a resistance of less than 0.1 ohms per inch, having sufficient flexibility so as to be at least partially compressible when the shield top and shield bottom are mated such that gaps between the mated surfaces are collapsible. Preferably, the material should resist peeling when applied to a metallic substrate. The preferred thickness of the gasket layer can also vary with the properties of the selected material.

The threaded holes can be plugged using fillers, such as individual pegs having diameters approximately matching or slightly smaller than an inner thread diameter of the respective holes which they are used to plug. The plug need not necessary occupy the entire volume of the threaded hole, but rather should prevent ingress of the gasket material into the threaded hole during application. In still further embodiments, set screws can be mated with the threaded holes to obstruct ingress of the gasket material. The fillers, when plugging the threaded holes, can be arranged approximately flush with the opening of the threaded hole so as to avoid a layer of film forming within the threads or the fillers can be arranged extending from the opening of the threaded hole. Alternatively, the fillers can include a lip having a diameter slightly larger than the inner diameter of the thread.

In embodiments, a fixture or other work-holding or support device can be used to securely locate (i.e., position in a specific location or orientation) and support the shield bottom. The fixture can include fillers prearranged relative to one another in a pattern corresponding to a layout of the threaded holes of the shield bottom. For example, a fixture or other piece can comprise a peg board having pegs extending from a base of the board in a pattern corresponding to the layout of the threaded holes. The shield bottom can be positioned and/or seated on the fixture so that the pegs plug the threaded holes, very quickly arranging the shield bottom for spray application of the gasket material. Alternatively, the fixture can be positioned and/or seated on the shield bottom so that the pegs plug the threaded holes. In an embodiment, such a fixture can be designed and created based on a specification sheet of the shield bottom. In an embodiment, if the fixture is used to guide movement of the spray tool, the fixture can comprise a jig.

Referring to FIG. 5, in an embodiment, a method for applying a shield gasket material to a shield can comprise cleaning the shield bottom (Step 100), positioning the shield bottom on a fixture such that fillers or pegs of the fixture are received within threaded holes (Step 202), and applying a coating of gasket material to the exposed surface of the shield bottom (Step 104). The shield bottom is removed from the fixture so as to unplug the threaded holes (Step 206).

Once the gasket material is applied, the threaded holes can be unplugged. In an embodiment, the threaded holes are exposed before the gasket material is cured, so that material applied over the plugged threaded holes can be lifted and removed with the plug, avoiding the need to cease application of material to skip over threaded holes. In other embodiments, the threaded holes are exposed after the gasket material is cured. Where the threaded holes are plugged with fillers or set screws, the threaded holes are unplugged by removing the fillers or set screws. Where the shield bottom is positioned on a fixture, the shield bottom is lifted or otherwise separated from the fixture to unplug the threaded holes.

Figure 8:
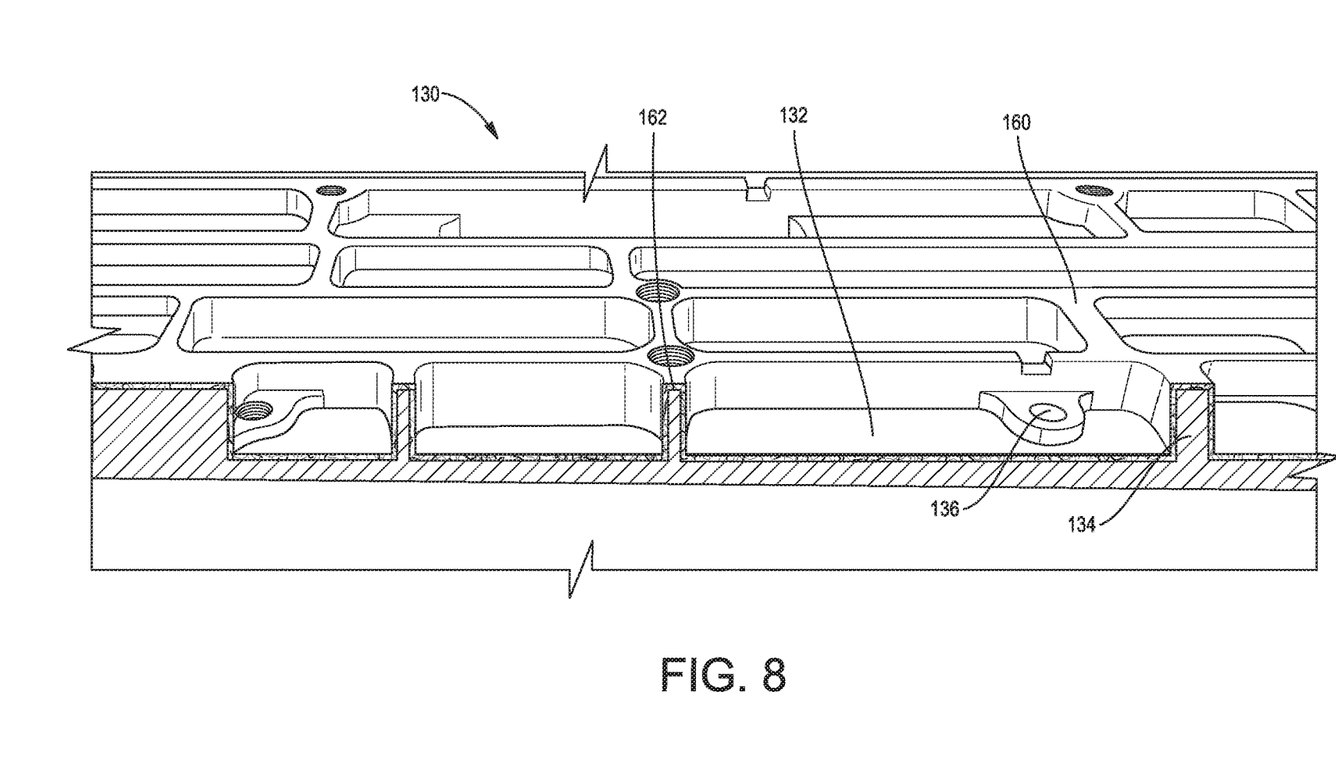
FIG. 8 illustrates a cross-section of the EMI shield of FIG. 6.

Referring to FIG. 6 and FIG. 8, an example can be seen of the conformity of a layer 162 of CHO-SHIELD® 4966 on a shield bottom 130. The layer is conformal to the sidewalls 134 of the pockets 132 and the mating surface 160 of the shield bottom appears even and flat, while the threaded holes 136 are exposed and free of the coating material.

Figure 7:
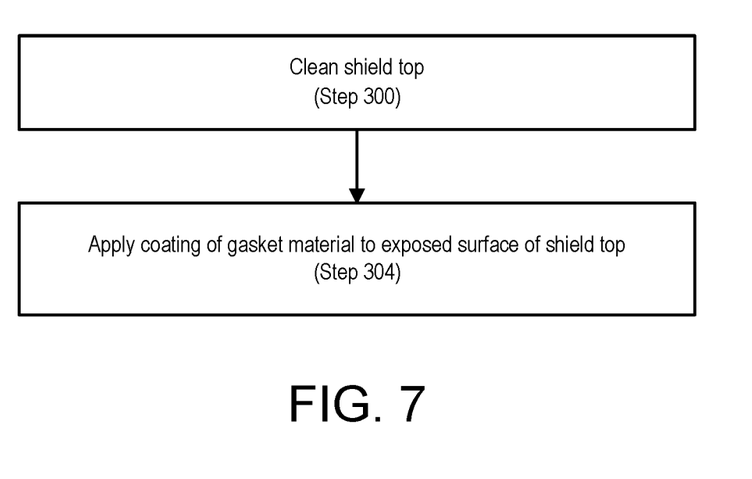
FIG. 7 is a flowchart for a method of providing a gasket layer on an EMI shield for a measurement instrument, in accordance with another embodiment.

In some embodiments, the shield top can likewise be coated with a layer of a similar material, if not the same material so that both mating surfaces include conductive silver-filled silicone coating. A cavity or pocket layout of the shield to need not necessarily match a cavity or pocket layout of the shield bottom. For example, for some PCBs blind vias are used on the top half of a PCB and blind vias on the bottom half of the PCB. Referring to FIG. 7, the shield top can be cleaned (Step 300), for example using a degreaser, and the layer of gasket material is applied to exposed surface of shield top (Step 304). As above, in an embodiment the layer can comprise CHO-SHIELD® 4966 having a thickness of 0.005 inches to 0.007 inches. Optionally, any threaded or non-threaded holes of the shield top can be plugged in a similar manner as described above. In an embodiment, the shield top and shield bottom can then be packaged individually to prevent damage to the gasket surface.

The method and shield gasket material can be approximately 20 times less expensive than high isolation Form-in-Place processes. Further, the method is a less complicated process, requires less process time, and requires no setup fees and no machine programming to precisely pass over mounting holes. There are no constraints on PCB design, no peeling of gasket material, and complete coverage with no peeling of gasket material.

Peeling of an applied coating is preferably avoided. For small pieces, or for certain pocket layouts, peeling can be problematic. In some embodiments, a method can further comprise roughening the exposed surface of the piece(s) (e.g., the shield bottom and/or top). Roughening can be accomplished, for example, by sand or bead blasting the exposed surface of the piece. In an embodiment, after the surface is roughened, the piece is cleaned, for example by degreasing the piece as described above.

In some embodiments, the present invention includes a computer program product which is a storage medium or computer readable medium (media) having instructions stored thereon/in which can be used to program a computer to perform any of the processes and methods or portions of the processes and methods of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. An electromagnetic interference (EMI) shield adapted to isolate a plurality of components of a measuring instrument, the EMI shield comprising:
   a shield bottom comprising a metallic substrate including a plurality of pockets, each pocket adapted to receive a component of the measuring instrument;
   wherein the plurality of pockets are formed in, and comprise a portion of, an inner surface of the shield bottom;
   wherein a further portion of the inner surface of the shield bottom is a mating surface at least partially defined by sidewalls of the plurality of pockets and adapted to be mated with a shield top to enclose the received components of the measuring instrument within the plurality of pockets;
   wherein the shield bottom includes a plurality of threaded holes adapted to receive fasteners to fixedly mate the shield top to the shield bottom; and
   a gasket layer comprising a gasket material substantially coating the inner surface of the shield bottom;
   wherein the gasket material is applied to the inner surface by spraying the gasket material over an exposed portion of the inner surface until the gasket layer is formed having a thickness at the mating surface of the shield bottom within a prescribed range;
   wherein the gasket material is flexible and conductive; and
   wherein threads of the plurality of threaded holes of the shield bottom are substantially free of the gasket material.

2. The EMI shield of claim 1, wherein the gasket layer has a thickness ranging from 0.005 inches to 0.007 inches.

3. The EMI shield of claim 1, wherein the gasket material is a conductive silver-filled silicone coating having a resistance less than 0.1 ohms per inch.

4. The EMI shield of claim 1, further comprising:
   the shield top, the shield top being a metallic structure; and
   a second gasket layer comprising the gasket material coating an exposed surface of the shield top;
   wherein the gasket material is applied to the exposed surface by spraying the gasket material over the exposed surface until the second gasket layer is formed having a thickness within a prescribed range.

5. The EMI shield of claim 4, wherein the gasket material is sufficiently flexible such that when the shield top is mated with the shield bottom, the gasket layer and the second gasket layer are configured to be at least partially compressed such that any gap between the shield top and the shield bottom is substantially eliminated.

6. The EMI shield of claim 1, wherein the shield bottom comprises an aluminum block into which the plurality of pockets have been milled.

7. An electromagnetic interference (EMI) shield adapted to isolate a plurality of components of a measuring instrument, the EMI shield comprising:
- a shield bottom comprising an aluminum block into which a plurality of pockets have been formed, each pocket adapted to receive a component of the measuring instrument;
- wherein the plurality of pockets are formed in, and comprise a portion of, an inner surface of the shield bottom;
- wherein a further portion of the inner surface of the shield bottom is a mating surface at least partially defined by sidewalls of the plurality of pockets;
- a shield top configured to be mated with the mating surface of the shield bottom to enclose received components of the measuring instrument within the plurality of pockets; and
- a gasket layer substantially coating the inner surface of the shield bottom, the gasket layer having a thickness at the mating surface within a prescribed range and comprising a conductive, spray-coated gasket material.

8. The EMI shield of claim 7, wherein the shield bottom includes a plurality of threaded holes adapted to receive a plurality of screws for fixing the shield top to the shield bottom, and wherein threads of the plurality of threaded holes of the shield bottom are substantially free of the gasket material.

9. The EMI shield of claim 7, wherein the gasket layer has a thickness ranging from 0.005 inches to 0.007 inches.

10. The EMI shield of claim 7, wherein the gasket material is a conductive, silver-filled silicone coating having a resistance less than 0.1 ohms per inch.

11. The EMI shield of claim 7, wherein the shield top comprises a metallic structure; and further comprising:
- a second gasket layer having a thickness at a mating surface of the shield top within a prescribed range and comprising a conductive gasket material spray-coated on the mating surface of the shield top.

12. The EMI shield of claim 11, wherein the gasket material is sufficiently flexible such that when the shield top is mated with the shield bottom, the gasket layer and the second gasket layer are configured to be at least partially compressed such that any gap between the shield top and the shield bottom is substantially eliminated.

* * * * *